United States Patent
Chu-Kung et al.

(10) Patent No.: US 8,890,118 B2
(45) Date of Patent: Nov. 18, 2014

(54) TUNNEL FIELD EFFECT TRANSISTOR

(75) Inventors: Benjamin Chu-Kung, Hillsboro, OR (US); Gilbert Dewey, Hillsboro, OR (US); Marko Radosavljevic, Beaverton, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 12/972,057

(22) Filed: Dec. 17, 2010

(65) Prior Publication Data

US 2012/0153263 A1    Jun. 21, 2012

(51) Int. Cl.
*H01L 29/06* (2006.01)
*H01L 29/08* (2006.01)
*H01L 29/739* (2006.01)

(52) U.S. Cl.
CPC ........ *H01L 29/7391* (2013.01); *H01L 29/0843* (2013.01)
USPC ......... 257/24; 257/27; 257/E29.255

(58) Field of Classification Search
CPC .. H01L 29/7391; H01L 29/165; H01L 2/1619
USPC ............ 257/24–30, E29.192, E29.395, 257/E21.399, E49.001, E49.002, E49.003, 257/E49.004, E29.255, E27.06, E21.409, 257/E21.09, E29.245
See application file for complete search history.

(56) References Cited

U.S. PATENT DOCUMENTS

| | | | | |
|---|---|---|---|---|
| 4,962,409 A | * | 10/1990 | Solomon | 257/192 |
| 5,552,330 A | * | 9/1996 | Tehrani et al. | 438/172 |
| 7,679,963 B2 | * | 3/2010 | Kakoschke et al. | 365/185.23 |
| 7,772,066 B2 | * | 8/2010 | Forbes | 438/257 |
| 8,143,113 B2 | * | 3/2012 | Bangsaruntip et al. | 438/149 |
| 8,258,031 B2 | * | 9/2012 | Lauer et al. | 438/264 |
| 8,441,000 B2 | * | 5/2013 | Chen et al. | 257/38 |
| 2007/0267619 A1 | | 11/2007 | Nirschl | |
| 2008/0067495 A1 | | 3/2008 | Verhulst | |
| 2008/0068895 A1 | * | 3/2008 | Kakoschke et al. | 365/185.23 |
| 2008/0073641 A1 | | 3/2008 | Cheng et al. | |
| 2009/0001350 A1 | * | 1/2009 | Hudait et al. | 257/14 |
| 2009/0026553 A1 | | 1/2009 | Bhuwalka et al. | |
| 2009/0072270 A1 | * | 3/2009 | Asbeck et al. | 257/190 |
| 2010/0163845 A1 | * | 7/2010 | Goel et al. | 257/24 |
| 2010/0327319 A1 | * | 12/2010 | Iacopi et al. | 257/192 |
| 2011/0215425 A1 | * | 9/2011 | Loh et al. | 257/410 |

FOREIGN PATENT DOCUMENTS

| | | |
|---|---|---|
| WO | 2012/082329 A2 | 6/2012 |
| WO | 2012/082329 A3 | 9/2012 |

OTHER PUBLICATIONS

Bhuwalka, Krishna K., et al., "Vertical Tunnel Field-Effect Transistor", IEEE Transactions on Electron Devices, vol. 51, No. 2, 0018-9383/04; 2004 IEEE,(Feb. 2004), pp. 279-282.

(Continued)

*Primary Examiner* — Cuong Q Nguyen
*Assistant Examiner* — Yosef Gebreyesus
(74) *Attorney, Agent, or Firm* — Winkle, PLLC

(57) ABSTRACT

The present disclosure relates to the field of microelectronic transistor fabrication and, more particularly, to the fabrication of a tunnel field effect transistor having an improved on-current level without a corresponding increasing the off-current level, achieved by the addition of a transition layer between a source and an intrinsic channel of the tunnel field effect transistor.

18 Claims, 6 Drawing Sheets

(56) References Cited

OTHER PUBLICATIONS

Ida, Minoru et al., "High-Speed InP/InGaAs DHBTs with a Thin Pseudomorphic Base", IEEE GaAs Digest, 0-7803-7833-4/03; 2003 IEEE; NTT Photonics Laboratories, NTT Corporation 3-1 Morinosato Wakamiya, Atsugi-shi, Kanagawa 243-0198, Japan; ida@aecl.ntt.co.jp; (now with NTT Advanced Technology Corporation),(2003), pp. 211-214.

International Search Report and Written Opinion received for PCT Application No. PCT/US2011/61792, mailed on Jun. 28, 2012, 11 Pages.

International Preliminary Report on Patentability received for PCT Patent Application No. PCT/US2011/061792, mailed on Jun. 27, 2013, 8 pages.

Office Action received for Korean Patent Application No. 2013-7015373, mailed on May 15, 2014, 5 pages of English Translation only.

* cited by examiner

TUNNEL FIELD EFFECT TRANSISTOR

BACKGROUND

Embodiments of the present description generally relate to the field of microelectronic device fabrication and, more particularly, to the fabrication of tunnel field effect transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1A:
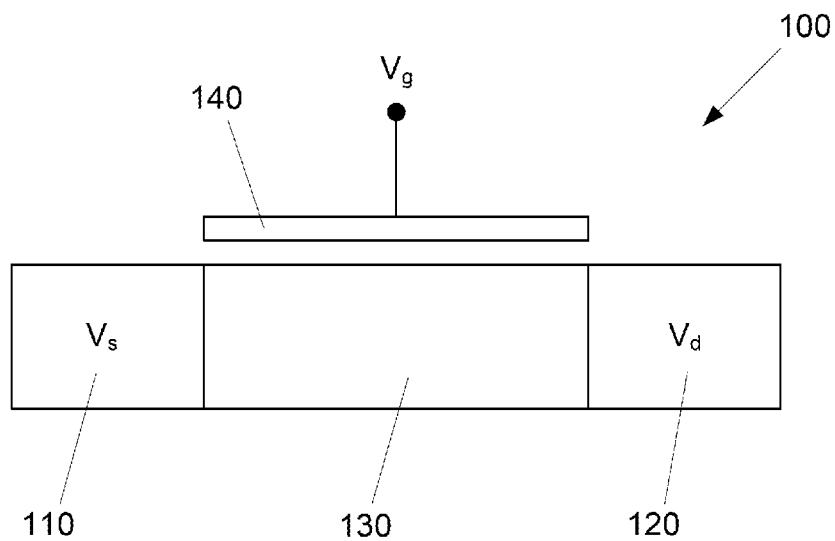
FIG. 1a illustrates a schematic of a tunneling field effect transistor, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description generally relate to the field of microelectronic transistor fabrication and, more particularly, to the fabrication of a tunnel field effect transistor having an improved on-current level without a corresponding increasing the off-current level, achieved by the addition of a transition layer between a source structure and an intrinsic channel of the tunnel field effect transistor.

Figure 1B:
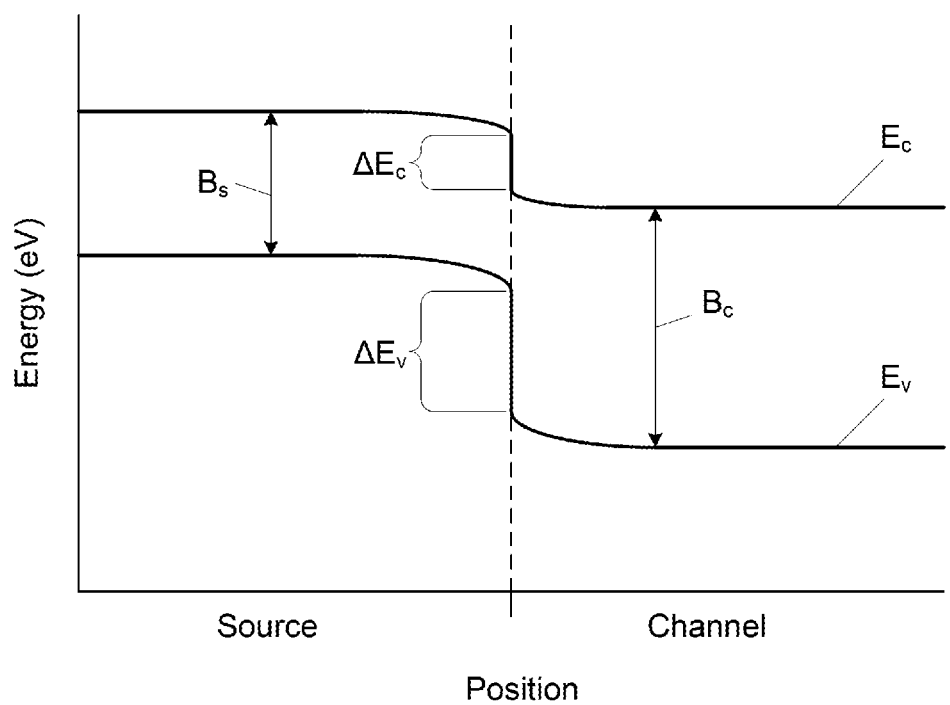
FIG. 1b is a generalized graph of the tunneling field effect transistor of FIG. 1a in an "off" state, as known in the art.
Figure 1C:
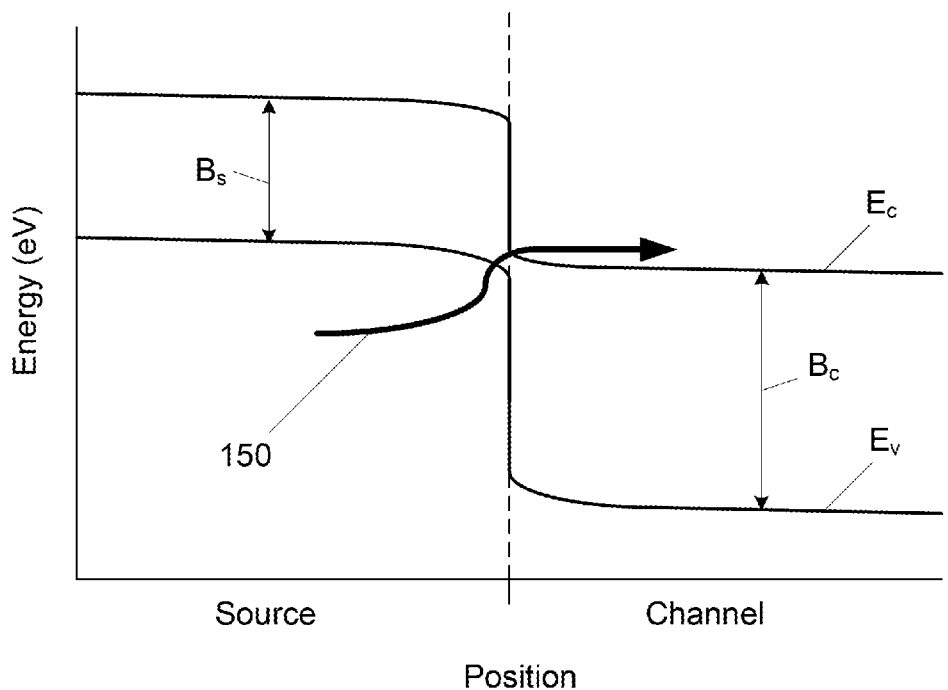
FIG. 1c is a generalized graph of the tunneling field effect transistor of FIG. 1a in an "on" state, as known in the art.

FIG. 1a illustrates a schematic of a tunnel field effect transistor and FIGS. 1b and 1c illustrate idealized graphs of its operation, as known in the art. As shown in FIG. 1a, a tunnel field effect transistor 100 may comprise a source structure 110 and a drain structure 120 separated by an intrinsic channel 130 with a gate 140 formed adjacent the intrinsic channel 130. Referring to FIGS. 1a and 1b, when the tunnel field effect transistor 100 in an "off" state, the voltage ("Vd") at the drain structure 120 may be positive and the voltage ("Vg") at the gate 140 may be substantially zero. In this "off" state, electrons will not flow through the intrinsic channel 130 between the source structure 110 and the drain structure 120. As shown in FIG. 1c, when the transistor in an "on" state, the voltage ("Vd") at the drain 120 is positive and the voltage ("Vg") at the gate 140 is positive. In this "on" state, electrons flow (demarked with arrow 150) through the intrinsic channel 130 between the source structure 110 and the drain structure 120, as the voltage ("Vg") to the gate 140 shifts the band-gap ("$B_c$") of the intrinsic channel 130 relative to the band-gap ("$B_s$"), which allows the electrons to flow.

As will be understood to those skilled in the art, tunnel field effect transistors may be utilized for achieving higher on-current/off-current than a conventional metal-on-silicon field effect transistor (MOSFET). A tunnel field effect transistor may achieve a lower off-current and a steeper sub-threshold slope, which may be needed for low operating voltage and low power applications. However, maintaining a high on-current may be difficult.

One method to increase the on-current is to migrate towards a lower band-gap, lower effective mass system. Although this will serve to increase the on-current, the off-state current suffers due to increased leakage.

In the tunnel field effect transistor 100, the on-current ("$I_{on}$") and the off-current ("$I_{off}$") are dominated by different parameters than the traditional metal-on-silicon field effect transistors ("MOSFET"). The on-current of a tunnel field effect transistor 100 may be defined by the effective mass of the carriers (i.e. electrons or holes), the electric field at the junction between the source structure 110 and the intrinsic channel 130, and the effective band-gap (the difference in energies between the conduction band ("$E_c$") of the intrinsic channel 130 and the valence band ("$E_v$") of the source structure for an n-type tunnel field effect transistor, or the valence band ("$E_v$") of the channel to the conduction band ("$E_c$") of the source). The off-current ("$I_{off}$") is defined by the reverse injection of carriers from the source structure 110 into the drain structure 120 and vice versa, any avalanche carrier creation, and the generation of additional carriers. For an ideal tunnel field effect transistor, a narrow band-gap source ("$B_s$") and a wide band-gap channel ("$B_c$") would be used, as shown in the energy band diagrams shown in FIGS. 1a and 1b.

Additionally, the choice of materials may have an effect on the on-current and off-current of a tunnel field effect transistor. Table 1 summarizes the parameters of two III-V tunnel field effect transistors. The first example in Table 1 has an source structure 110 fabricated from an alloy of gallium ("Ga"), arsenic (As), and antimony (Sb) ("GaAsSb") and an intrinsic channel 130 formed from indium phosphide ("InP"). The choice of indium phosphide to form a wide band-gap ("$B_c$") channel will limit the effective band-gap to about 0.54 eV. In order to achieve a smaller effective band-gap, the indium phosphide intrinsic channel 130 can be replaced by a smaller band-gap system, such as an alloy of indium (In), gallium (Ga), and arsenic (As) ("InGaAs"). However, doing so would sacrifice $I_{off}$

TABLE 1

| Source Material | Source $E_G$(eV) | Channel Material | Channel $E_G$(eV) | Tunneling $E_G$(eV) | $\Delta E_c$ (ev) |
|---|---|---|---|---|---|
| GaAsSb | 0.72 | InP | 1.35 | 0.54 | 0.18 |
| GaAsSb | 0.72 | InGaAs | 0.74 | 0.25 | 0.47 |

Figure 2:
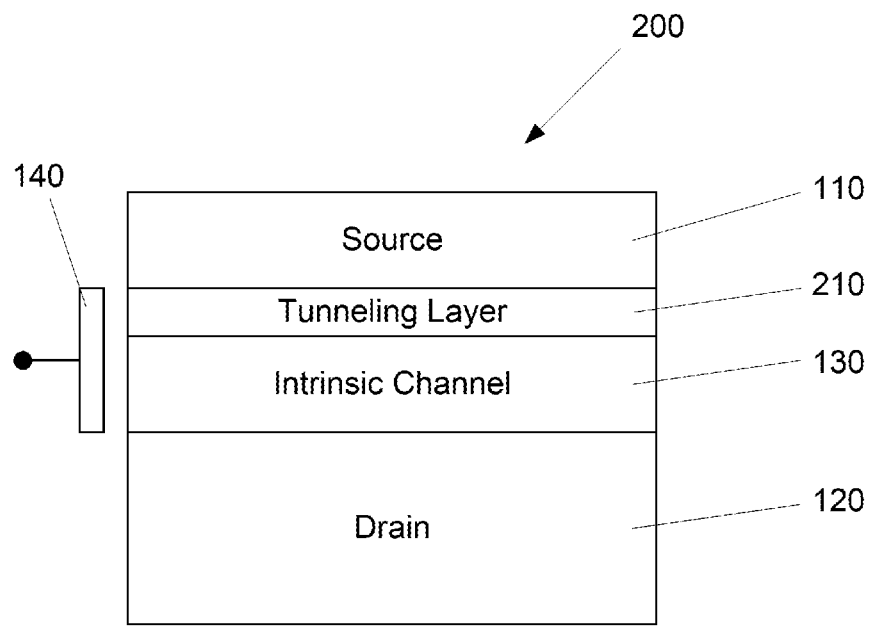
FIG. 2 illustrates a schematic of a tunneling field effect transistor in accordance with embodiments of the present description.

FIG. 2 illustrates one embodiment of the present description, wherein a transition layer 210 may be formed between the source structure 110 and the intrinsic channel 130, and may be separate from the source structure 110 and the intrinsic channel 130, to form a tunnel field effect transistor 200 (connections to the source structure 110 and the drain structure 130 are not shown). The transition layer 210 may effectively increase the on-current with a negligible effect on the off-current.

In one embodiment, the tunnel field effect transistor 200 may be made from semiconductor elements in groups III, IV, and V of the periodic table of chemical elements, including but not limited to aluminum, antimony, arsenide, gallium, germanium, tin, indium, nitrogen, silicon, and phosphorous. In an embodiment of the present description, the source structure 110 may be a gallium/arsenic/antimony alloy (GaAsSb), the transition layer 210 may be indium arsenide (InAs), and the intrinsic channel 130 may be indium phosphide (InP). In another embodiment of the present description, the source structure 110 may be a gallium/arsenic/antimony (GaAsSb) alloy, the transition layer 210 may be an indium gallium arsenide alloy (InGaAs), and the intrinsic channel 130 may be indium phosphide (InP). In yet another embodiment of the present description, the source structure 110 may be an indium/gallium/arsenic alloy (InGaAs), the transition layer 210 may be indium arsenide (InAs), and the intrinsic channel 130 may be indium phosphide (InP). In still yet another embodiment of the present description, the source structure 110 may be an indium/gallium/arsenic alloy (InGaAs), the transition layer 210 may also be an indium/gallium/arsenic alloy (InGaAs) having an indium content higher than the indium/gallium/arsenic alloy (InGaAs) of the source structure 110, and the intrinsic channel 130 may be indium phosphide (InP). It is understood that each of the components in the alloys of the source structure 110, the transition layer 210, and the intrinsic channel 130 may have any appropriate atomic percentage relative to one another within each alloy.

The transition layer 210 may be composed of a single layer or multiple layers. Furthermore, the transition layer 210 may be sufficiently thin such that the transition layer 210 need not be lattice matched to either the source structure 110 or the intrinsic channel 130 to prevent defects. Moreover, the transition layer 210 may be doped, as will be understood to those skilled in the art.

Figure 3:
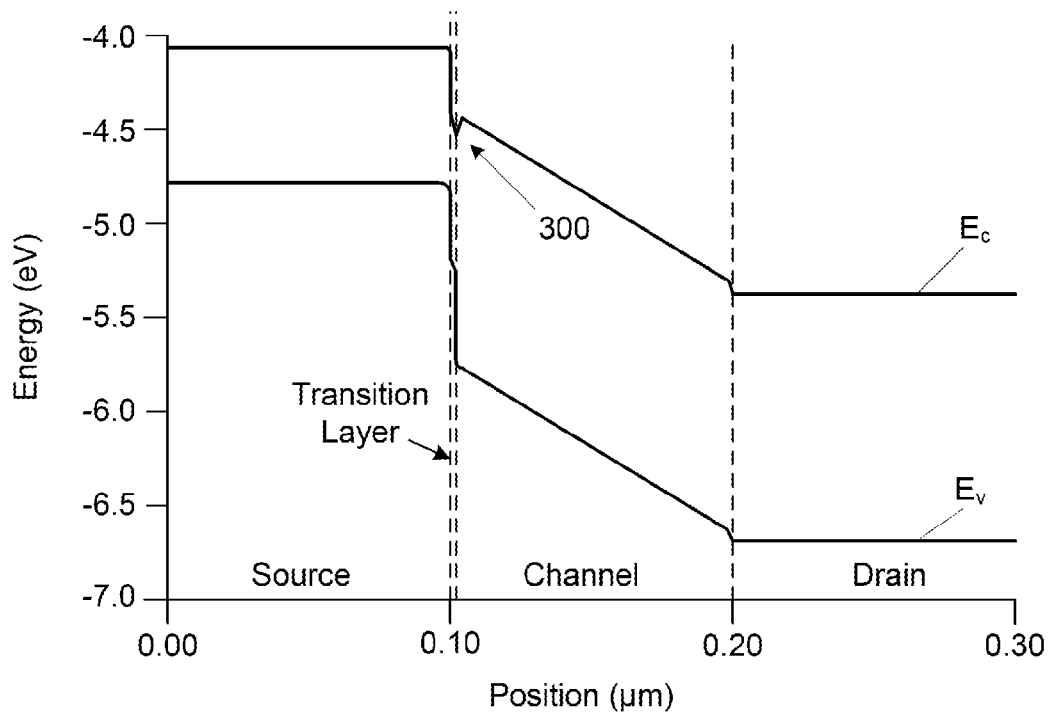
FIG. 3 is a graph of the tunneling field effect transistor of FIG. 2 in an "off" state, according to embodiments of the present description.
Figure 4:
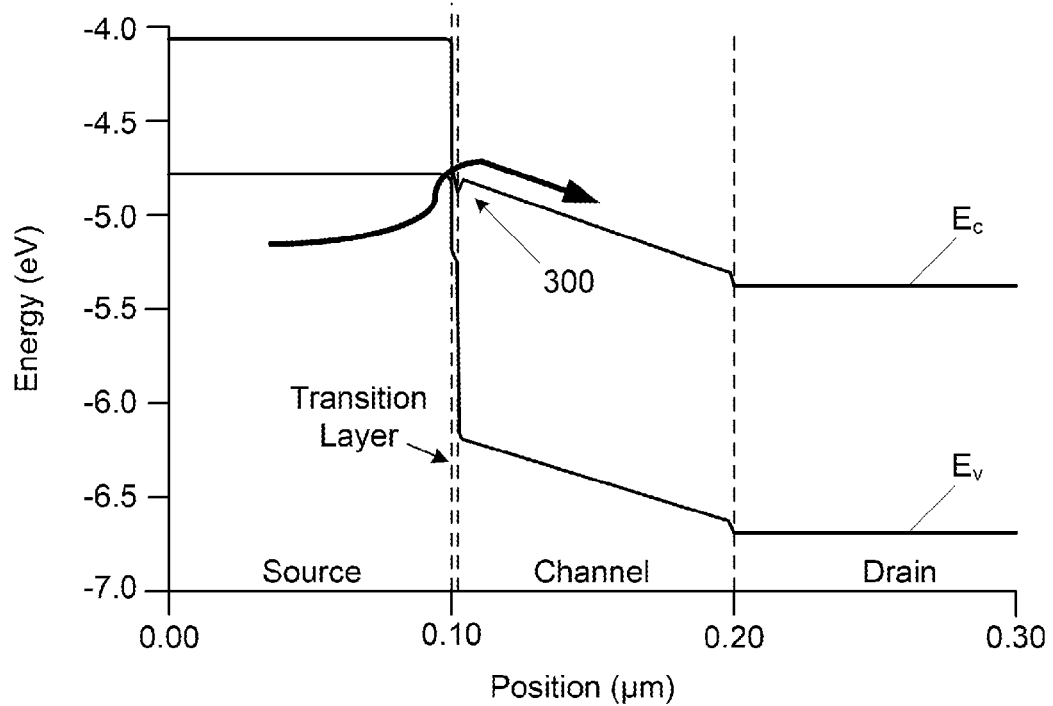
FIG. 4 is a graph of the tunneling field effect transistor of FIG. 2 in an "on" state, according to embodiments of the present description.

FIGS. 3 and 4 illustrate an embodiment of the tunnel field effect transistor 200 in an off-state (FIG. 3) and an on-state (FIG. 4). The general off-state mechanism is the similar to that described for tunnel field effect transistor 100 in FIG. 1b, and the general on-state mechanism is similar to that described to tunnel field effect transistor 100 in FIG. 1c. It is noted that the transition layer 210 is included in FIGS. 3 and 4 does not designate any specific thickness for the transition layer 210. Rather the position of the transition layer 210 is merely included for the sake of clarity. In one embodiment illustrated in FIGS. 3 and 4, the source layer may be a gallium/arsenic/antimony (GaAsSb) alloy, the transition layer may be an indium gallium arsenide alloy (InGaAs), and the intrinsic channel may be indium phosphide (InP), wherein the source layer and the transition layer are lattice matched to the channel.

Figure 5:
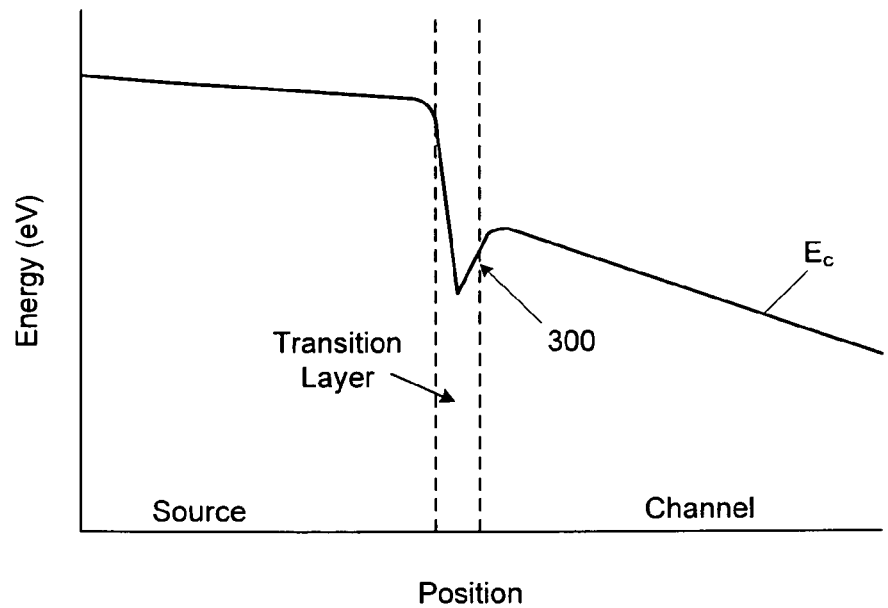
FIG. 5 is a graph of the conduction band of the tunneling field effect transistor of FIG. 2 where a discontinuity exists proximate the transition layer.

As can be seen in FIG. 5, a discontinuity 300 may form in the conduction band ("$E_c$") proximate the transition layer 210 (see FIG. 2). The discontinuity 300 can trap carriers, which can have adverse consequences with the reliability of tunnel field effect transistors 200 (see FIG. 2), as will be understood to those skilled in the art.

Figure 6:
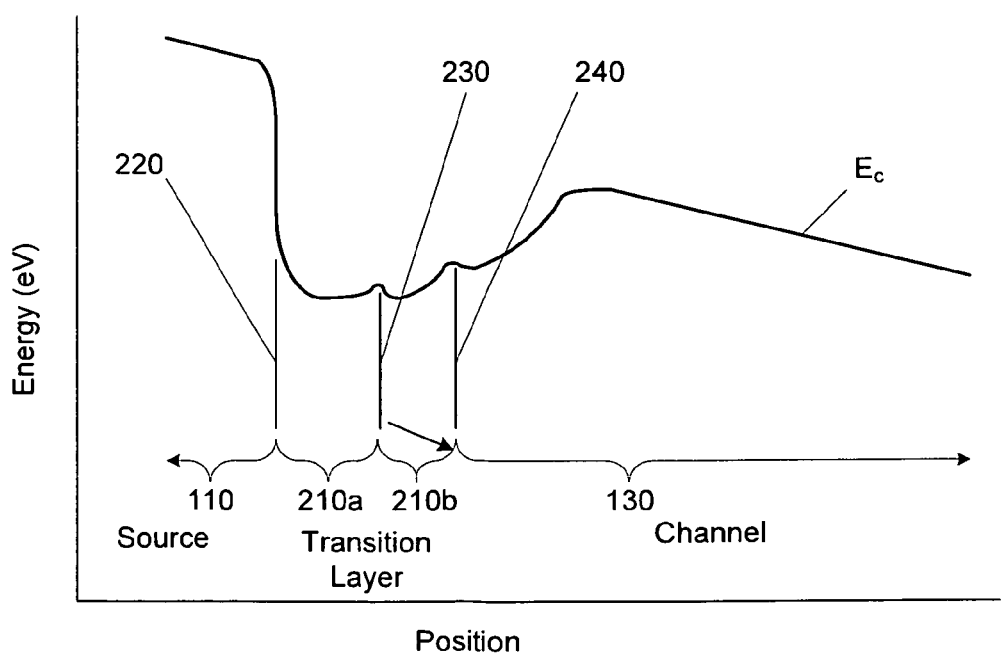
FIG. 6 illustrates a schematic of the smoothing of a discontinuity with a multilayered transition layer, according to embodiments of the present description.

It has been found that the discontinuity 300 may be damped by providing additional heterojunctions. As know to those skilled in the art, a heterojunction is the interface that occurs between two layers or regions of dissimilar crystalline semiconductors and unequal band-gaps. As shown in FIG. 6, the transition layer 210 (see FIG. 2) may be formed with two layers, a first transition layer 210a and a second transition layer 210b. The first transition layer 210a abutting the source structure 110 forms a first heterojunction 220. The second transition layer 210b abutting the first transition layer 210a forms a second heterojunction 230. The intrinsic channel 130 abutting the second transition layer 210b forms a third heterojunction 240. The formation for multiple transition layers (e.g. first transition layer 210a and second transition layer 210b) and multiple heterojunctions (e.g. first heterojunction 220, second heterojunction 230, and third heterojunction 240) may smooth out the discontinuity to result is a discontinuity 300 small enough that carriers can either thermalize out at room temperature or may gain the energy needed to escape the discontinuity from the applied electric field, as will be understood to those skilled in the art. It is further understood that although two transition layers are shown in FIG. 6, any appropriate number of layers may be used to form the transition layer 210.

Although methods that may be used in fabricating the tunnel field effect transistors 200 are not specifically described herein, it is understood that such method are well known in the art and may include molecular beam epitaxy, lithography, etch, thin films deposition, chemical vapor deposition, physical vapor deposition, atomic layer disposition, planarization (such as chemical mechanical polishing (CMP)), diffusion, metrology, the use of sacrificial layers, the use of etch stop layers, the use of planarization stop layers, and/or any other associated action with microelectronic component fabrication.

It will be understood to those skilled in the art, the tunnel field effect transistor 200 may be utilized in variety of integrated circuits and devices, including but not limited, microprocessors, application specific integrated circuit, chipsets, and memory devices.

Figure 7:
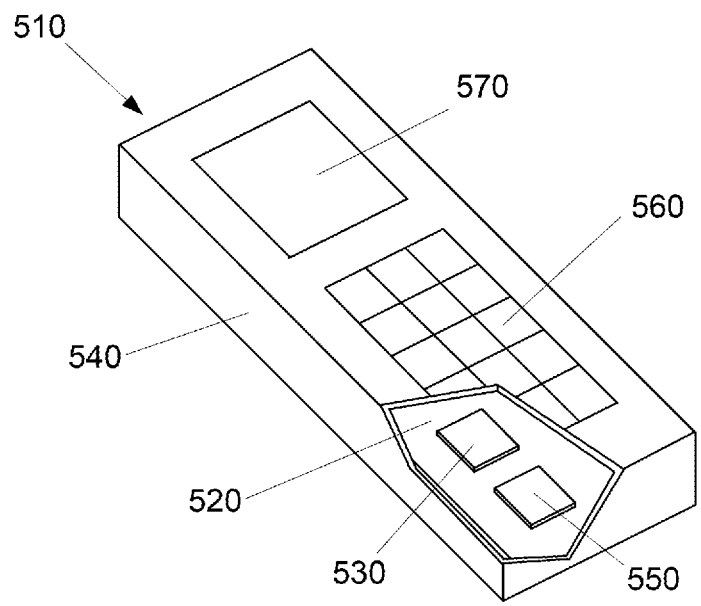
FIG. 7 illustrates an embodiment of a portable electronic device, according to embodiments of the present description.

FIG. 7 illustrates an embodiment of a portable device 510, such as a cellular telephone or a personal data assistant (PDA), digital media player, of the like. The portable device 510 may comprise a substrate 520 within a housing 530. The substrate 520 may have various electronic components electrically coupled thereto including a microprocessor 540, such as a central processing units (CPUs), chipsets, graphics processor, ASICs, or other command/data processing device, and including at least one memory device 550 having at least one memory cell having a fully or partially removed blocking layer portion as described in the present description. The substrate 520 may be attached to various peripheral devices including an input device, such as keypad 560, and a display device, such an LCD display 570.

Figure 8:
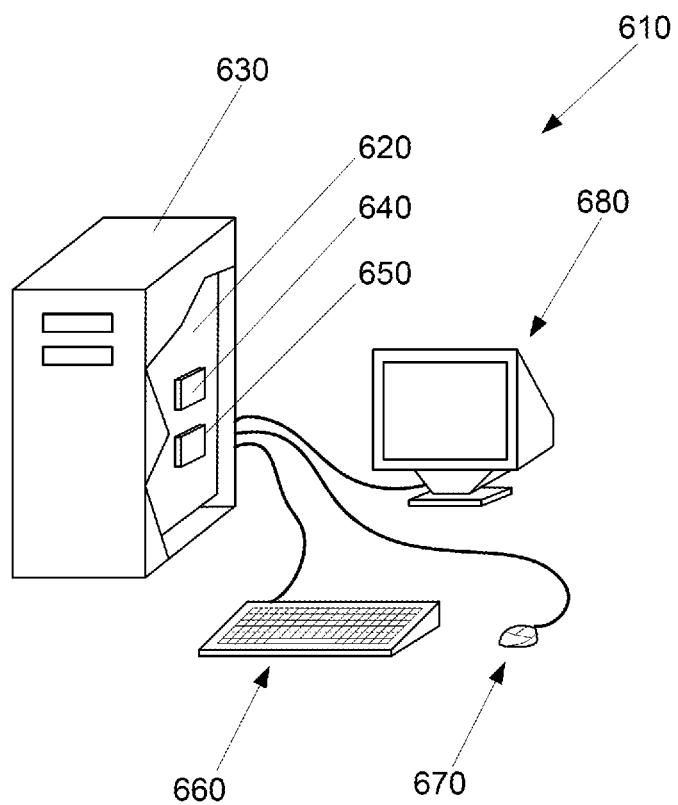
FIG. 8 illustrates an embodiment of a computer system, according to embodiments of the present description.

FIG. 8 illustrates an embodiment of a computer system 610. The computer system 610 may comprise a substrate or motherboard 620 within a housing 630. The motherboard 620 may have various electronic component electrically coupled thereto including a microprocessor 640, such as a central processing units (CPUs), chipsets, graphics processor, ASICs, or other command/data processing device, and at least one memory device 650, including but not limited to, a BIOS chip, a solid state drive, and the like. The microprocessor 640 and/or the memory device 650 having at least one tunnel field effect transistor having a transition layer between a source structure and an intrinsic channel, as described above. The substrate or motherboard 620 may be attached to various peripheral devices including inputs devices, such as a keyboard 660 and/or a mouse 670, and a display device, such as a monitor 680.

Figure 9:
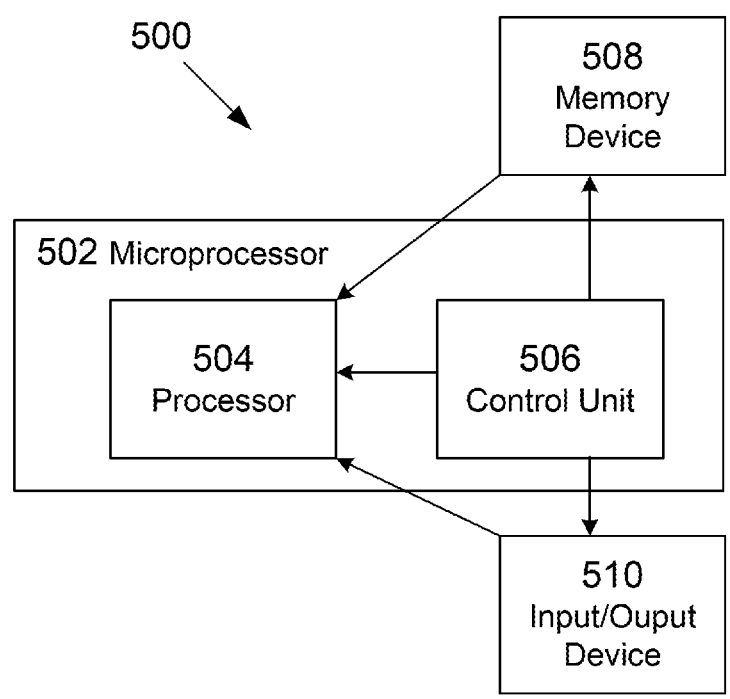
FIG. 9 is a block diagram of an electronic system, according to embodiments of the present description.

FIG. 9 illustrates a block diagram of an electronic system 700. The electronic system 700 can correspond to, for example, the portable system 510 of FIG. 7, the computer system 610 of FIG. 8, a process control system, or any other system that utilizes a processor and an associated memory. The electronic system 700 may have a microprocessor 702 (having a processor core 704 and control unit 706), a memory device 706, and an input/output device 708 (it is, of course, understood that the electronic system 700 can have a plurality of processors, control units, memory device units and/or input/output devices in various embodiments). In one embodiment, the electronic system 700 may have a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include flash memory having at least one microelectronic cell having a fully or partially removed blocking layer portion in the wordline direction.

It is also understood that the subject matter of the present description is not necessarily limited to specific applications illustrated in FIGS. 1-9. The subject matter may be applied to other transistor devices and applications, as will be understood to those skilled in the art.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A tunnel field effect transistor comprising:
   a source structure;

a transition layer, formed of multiple layers, adjacent the source structure;
an intrinsic channel layer adjacent the transition layer; and
a drain structure adjacent the intrinsic channel;
wherein a first layer of the multiple layers of the transition layer abuts the source structure forming a heterojunction; wherein a second layer of the multiple layers of the transition layer abuts the intrinsic channel layer forming a heterojunction; wherein the first layer of the multiple layers of the transition layer separates the second layer of the multiple layers of the transition layer from the source structure; wherein the second layer of the multiple layers of the transition layer separates the first layer of the multiple layers of the transition layer from the intrinsic channel layer; and a heterojunction between the first layer and the second layer of the multiple layers of the transition layer.

2. The tunnel field effect transistor of claim 1, wherein the source structure is an alloy of aluminum, antimony, arsenide, gallium, indium, nitrogen, or phosphorous.

3. The tunnel field effect transistor of claim 2, wherein the source structure is a gallium/arsenic/antimony alloy.

4. The tunnel field effect transistor of claim 2, wherein the source structure is a indium/gallium/arsenic alloy.

5. The tunnel field effect transistor of claim 2, wherein at least one of the first layer and the second layer of the multiple layers of the transition layer is indium arsenide.

6. The tunnel field effect transistor of claim 2, wherein at least one of the first layer and the second layer of the multiple layers of the transition layer is indium/gallium/arsenide alloy.

7. The tunnel field effect transistor of claim 2, wherein the intrinsic layer is indium phosphide.

8. The tunnel field effect transistor of claim 1, wherein at least one of the first layer and the second layer of the multiple layers of the transition layer is an alloy of aluminum, antimony, arsenide, gallium, indium, nitrogen, or phosphorous.

9. The tunnel field effect transistor of claim 1, wherein the intrinsic layer is an alloy of aluminum, antimony, arsenide, gallium, indium, nitrogen, or phosphorous.

10. An electronic system, comprising:
a processor; and
a memory device in data communication with the processor;
wherein at least one of the processor and the memory device includes at least one tunnel field effect transistor comprising:
a source structure;
a transition layer, formed of multilayers, adjacent the source structure;
an intrinsic channel layer adjacent the transition layer; and
a drain structure adjacent the intrinsic channel;
wherein a first layer of the multiple layers of the transition layer abuts the source structure forming a heterojunction; wherein a second layer of the multiple layers of the transition layer abuts the intrinsic channel layer forming a heterojunction; wherein the first layer of the multiple layers of the transition layer separates the second layer of the multiple layers of the transition layer from the source structure; wherein the second layer of the multiple layers of the transition layer separates the first layer of the multiple layers of the transition layer from the intrinsic channel layer; and a heterojunction between the first layer and the second layer of the multiple layers of the transition layer.

11. The electronic system of claim 10, wherein the source structure is an alloy of aluminum, antimony, arsenide, gallium, indium, nitrogen, or phosphorous.

12. The electronic system of claim 11, wherein the source structure is a gallium/arsenic/antimony alloy.

13. The electronic system of claim 11, wherein the source structure is a indium/gallium/arsenic alloy.

14. The electronic system of claim 11, wherein at least one of the first layer and the second layer of the multiple layers of the transition layer is indium arsenide.

15. The electronic system of claim 11, wherein at least one of the first layer and the second layer of the multiple layers of the transition layer is indium/gallium/arsenide alloy.

16. The electronic system of claim 11, wherein the intrinsic layer is indium phosphide.

17. The electronic system of claim 10, wherein at least one of the first layer and the second layer of the multiple layers of the transition layer is an alloy of aluminum, antimony, arsenide, gallium, indium, nitrogen, or phosphorous.

18. The electronic system of claim 10, wherein the intrinsic layer is an alloy of aluminum, antimony, arsenide, gallium, indium, nitrogen, or phosphorous.

* * * * *